United States Patent [19]
Leiwe

[11] Patent Number: 4,765,376
[45] Date of Patent: Aug. 23, 1988

[54] LEAD STRAIGHTENING FOR LEADED PACKAGED ELECTRONIC COMPONENTS

[75] Inventor: Daniel R. Leiwe, Royal Palm Beach, Fla.

[73] Assignee: Northern Telecom Limited, Montreal, Canada

[21] Appl. No.: 43,407

[22] Filed: Apr. 28, 1987

[51] Int. Cl.[4] .............................................. B21F 1/02
[52] U.S. Cl. .............................................. 140/147
[58] Field of Search ...................................... 140/147

[56] References Cited

U.S. PATENT DOCUMENTS

| | | | |
|---|---|---|---|
| 3,439,402 | 4/1969 | Chin et al. | 140/147 |
| 3,880,205 | 4/1975 | Linker et al. | 140/147 |
| 4,397,341 | 8/1983 | Kent | 140/147 |
| 4,620,572 | 11/1986 | Baker et al. | 140/105 |
| 4,691,747 | 9/1987 | Sokolovsky | 140/147 |

Primary Examiner—Lowell A. Larson
Attorney, Agent, or Firm—Foley & Lardner, Schwartz, Jeffery, Schwaab, Mack, Blumenthal & Evans

[57] ABSTRACT

Leads of a leaded component are straightened by bending the leads outward past the yield point of the lead material, and then bending the leads inward past the yield. In a particular arrangement, a component rests with the lower or outer ends of the leads in transverse grooves in sliding members. The sliding members are moved outward, bending the leads outward. The component is then pushed up between comb members having inner end surfaces with ribs and grooves. The leads move up in the grooves and are bent inward.

16 Claims, 5 Drawing Sheets

LEAD STRAIGHTENING FOR LEADED PACKAGED ELECTRONIC COMPONENTS

BACKGROUND OF THE INVENTION

1. Field of the Invention

This invention relates to the straightening of leads of leaded components, particularly leaded packaged semiconductor components for mounting on circuit boards.

2. Related Art

With increasing density of devices, such as large scale integrated circuits or chips, the number of leads has increased but the actual size of the circuit or chip has not increased to the same extent. The width of the individual leads and the spacing between the leads has decreased. Lead widths and spacing of 0.025 inches is now common, that is, a 0.050 inch pitch.

The leads are quite fragile. At the same time, the leads must be straight and parallel. The components are usually surface mounted, which requires that contact pads be formed in the circuit of the circuit board at very precise positions and with very closely controlled dimensions. The bottom ends of the leads must align accurately with the contact pads.

It is very easy for one or more leads to become bent or otherwise displaced. The packaged components are often supplied and stored stacked in tubes. If a tube is dropped, then depending on how it is dropped, all the leads on one side of each component can become displaced. Because of the difficulty in moving the leads back into a correct position, it has been customary to scrap those components which have displaced leads.

SUMMARY OF THE INVENTION

The present invention provides for the rapid, easy and accurate straightening of any displaced leads. Straightening is carried out in two stages, all the leads first being opened out, and then all the leads being bent back to a correct position. Broadly, in accordance with the invention, a leaded component is supported with the bottom ends of the leads for a side resting in a grooved member. There is a grooved member for each side. The grooved members move outwards, pulling the leads outward, the leads being bent beyond the yield point of the material. The component is then pushed between four comb members which push the leads back in, again bending the leads beyond the yield point. All the leads finish up straight and parallel, and if so required, extending normal to the plane of the circuit board on which they are mounted.

BRIEF DESCRIPTION OF THE DRAWINGS

The invention will be readily understood by the following description of certain embodiments, by way of example, in conjunction with the accompanying drawings, in which.

DETAILED DESCRIPTION OF THE EMBODIMENTS

Figure 1:
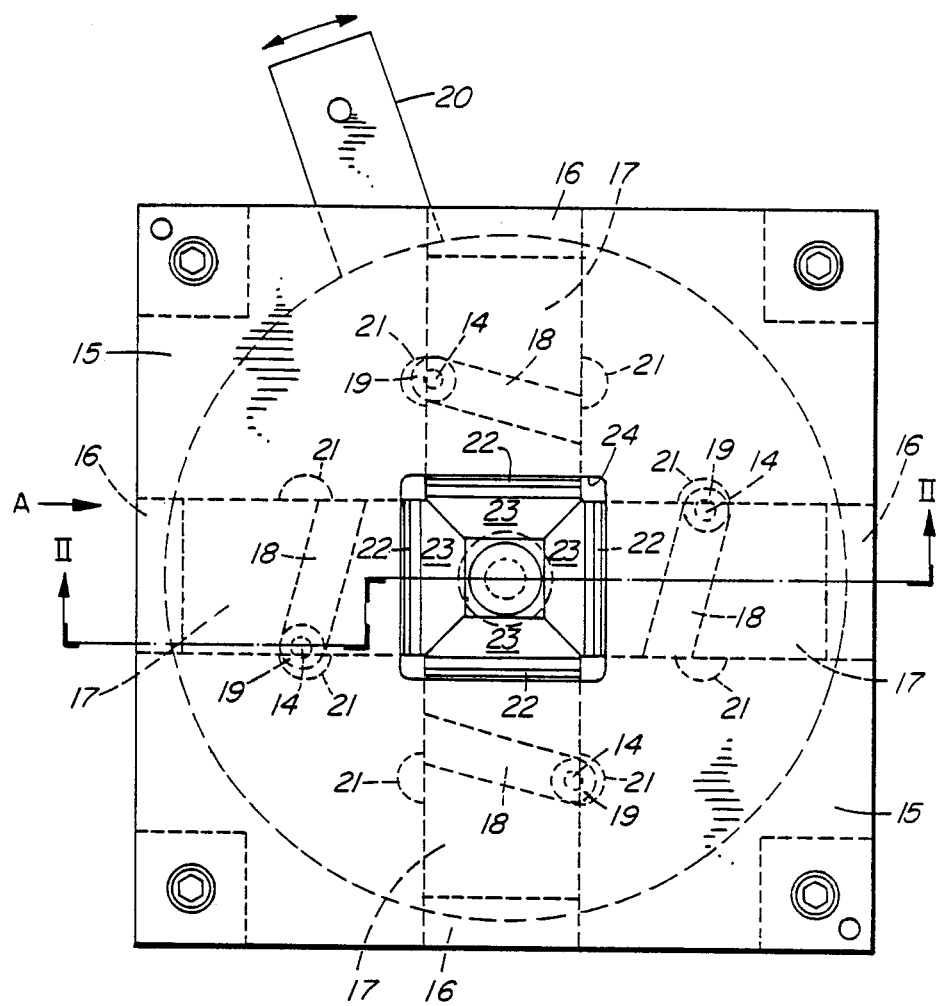
FIG. 1 is a top plan view of an apparatus for bending leads outward, in a closed condition.
Figure 2:
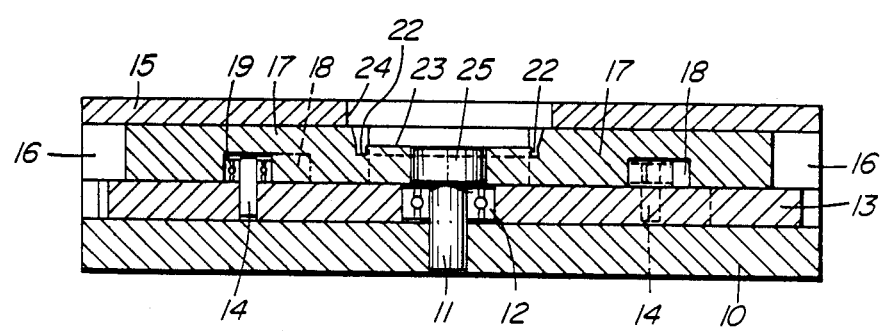
FIG. 2 is a cross-section on the line II of FIG. 1.
Figure 3:
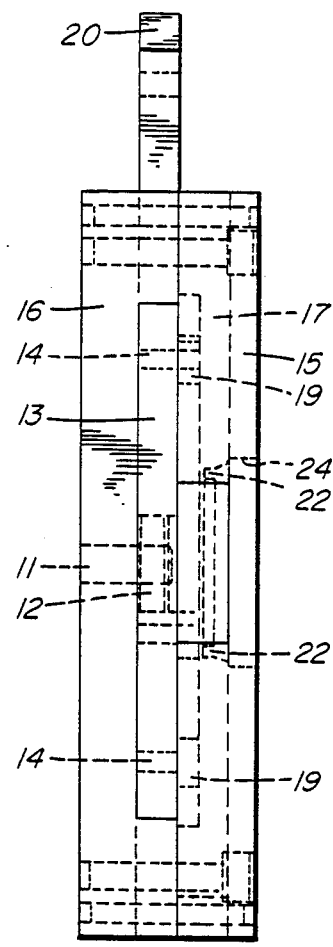
FIG. 3 is a side view in the direction of arrow A in FIG. 1.

As illustrated in FIGS. 1 to 4, a lead opening apparatus comprises a support base member 10 in which is mounted a shaft 11. Rotationally mounted on the base member via a bearing 12 on shaft 11 is an actuating plate 13. Plate 13 has a plurality of actuating members or pins 14, in the example four extending up from its top surface. Mounted on the base member also is a top member 15. The top member has four channels 16 formed therein, 90° apart. Sliding in each channel 16 is a lead bending member 17. Each member 17 has a transverse slot 18 in its lower surface in which can slide a bearing 19 mounted on pin 14. The slots 18 are angled slightly to the normal of the sliding axes of the member 17. By rotating the actuating plate 13, pins and bearings 14 and 19 slide in the slots 18 and move the members in or out, depending upon the direction of rotation of the actuating plate 13. The plate 18 can be rotated, for example, by a pneumatic ram or other device, acting on the lever 20. The lever 20 can also be moved by hand. Semicircular recesses 21 are formed in the member 17 to permit the bearings 19 to slide right to the end of the transverse slots 18.

Each lead bending member 17 has a transverse groove 22 in its upper surface 23 at the inner end. In the example, this upper surface is recessed down at the inner end and a clearance aperture 24 is formed in the top member 15. This provides for positioning and guiding of a leaded component as it is loaded into the apparatus. The grooves 22 are positioned so that, as a component is put into position, the leads are in the grooves. Conveniently, a support member 25 is attached to the top of the shaft 11 to support the component, in combination with the recessed down inner ends of the lead bending members.

Figure 4:
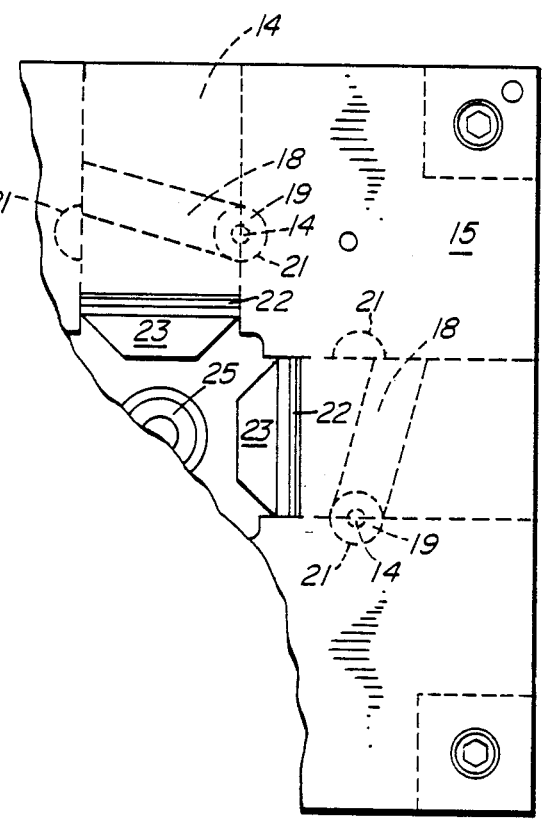
FIG. 4 is a partial top plan view of the apparatus of FIG. 1, in an open or actuated condition.
Figure 5:
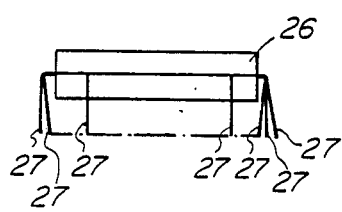
FIG. 5 illustrates a component in side view showing possible lead displacements.
Figure 6:
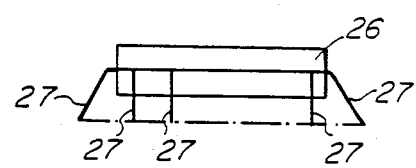
FIG. 6 is a similar view to FIG. 5, illustrating the position of leads after having been acted upon by the apparatus of FIGS. 1 to 4.

With a component in position, the lever 20 is moved to rotate the actuating plate 13, moving pins and bearings 14 and 19 and causing the lead bending members 17 to move outward and bend all the leads outward. The bending is such that the yield point of the lead material is exceeded. The movement of pins and bearings 14 and 19 and the members 17 is shown in FIG. 4. A typical component 26 with some of the leads 27 displaced is illustrated in FIG. 5, and the situation after bending or opening of the leads is seen in FIG. 6. The component is removed and the lever 20 moved back to its original position, moving members 17 to move back inwards. A further component is positioned and the cycle repeated. The process can be automated with an automated loading and unloading machine placing components in position and then removing them, the lever 20 being moved by a ram controlled by a central control which also controls the loading machine.

Figure 7:
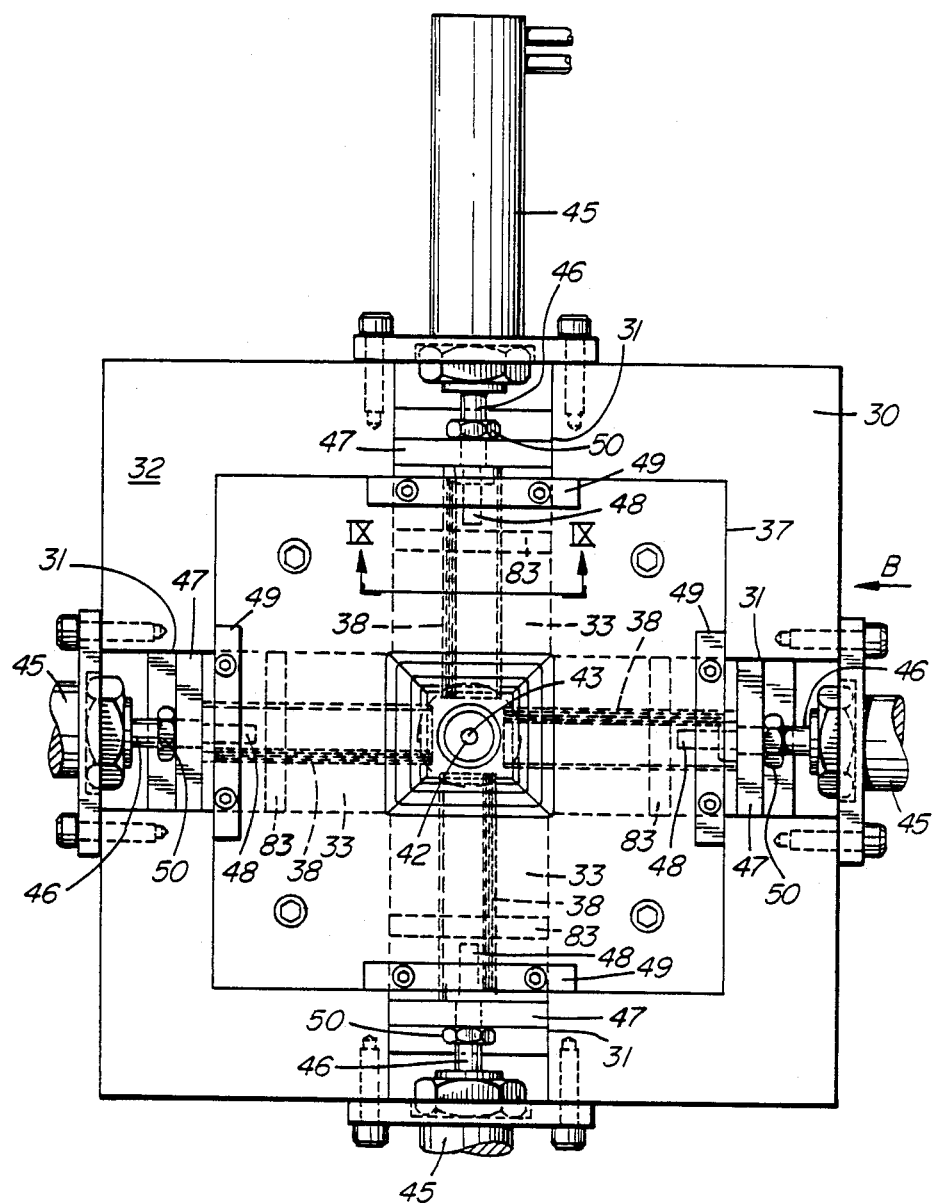
FIG. 7 is a top plan view of an apparatus for bending leads inward.
Figure 8:
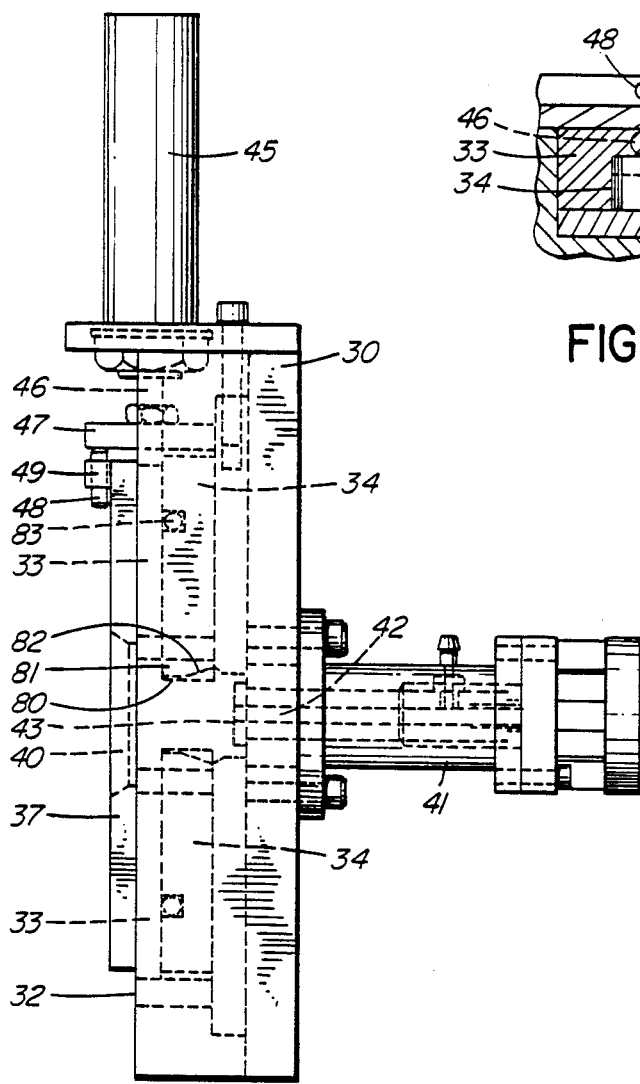
FIG. 8 is a side view in the direction of arrow B in FIG. 7.
Figure 9:
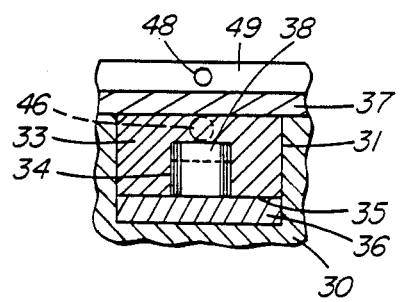
FIG. 9 is a cross-section on the line IX—IX of FIG. 7.

Once the leads have been bent outward, they are then bent back inward. FIGS. 7 to 12 illustrate a form of apparatus for doing this. As shown in FIGS. 7 and 8, a support member 30 has four channels 31 formed therein, extending down into the member from a top surface 32. A sliding member 33 is positioned in each channel and each sliding member has a rectangular cross-section groove 34 extending up from its lower surface 35. A bearing member 36 is positioned in the bottom of each channel 31. A cap member 37 is attached to the support member 30 and holds the sliding members 33 in the channels 31. Positioned in each groove 34 is a comb member 38, described in more detail later.

The cap member 37 has a square aperture at its center, and the aperture exposes the inner ends of the comb members 38, when sliding members 33 are in the inward position. Mounted on the bottom surface of the support member 30 is a pneumatic ram 41. The rod 42 of the ram extends up through the support member to a position where the top surface 43 of the rod 42 is a short distance above the bottom surfaces of the channels 31. The rod 42 is coaxial with the aperture 40.

At each side of the support member 30 is mounted a pneumatic ram 45. The rod 46 of each ram 45 connects with a sliding member 33. An upwardly extending projection 47 is provided at the outer end of each sliding member. A threaded pin 48 is mounted on the top surface of the cap member, in a threaded hole in member 49. The pins 47 act as stops for the projections 46 and thus the sliding member 33. The rods 46 of the rams 45 are connected to the sliding members 33 by threaded portions which can be screwed in or out in the sliding member. This enables adjustment of the sliding members to be carried out. The rods of the rams are then locked in position by locking members 50. FIGS. 7 and 8 illustrate the apparatus in a closed condition.

Figure 12:
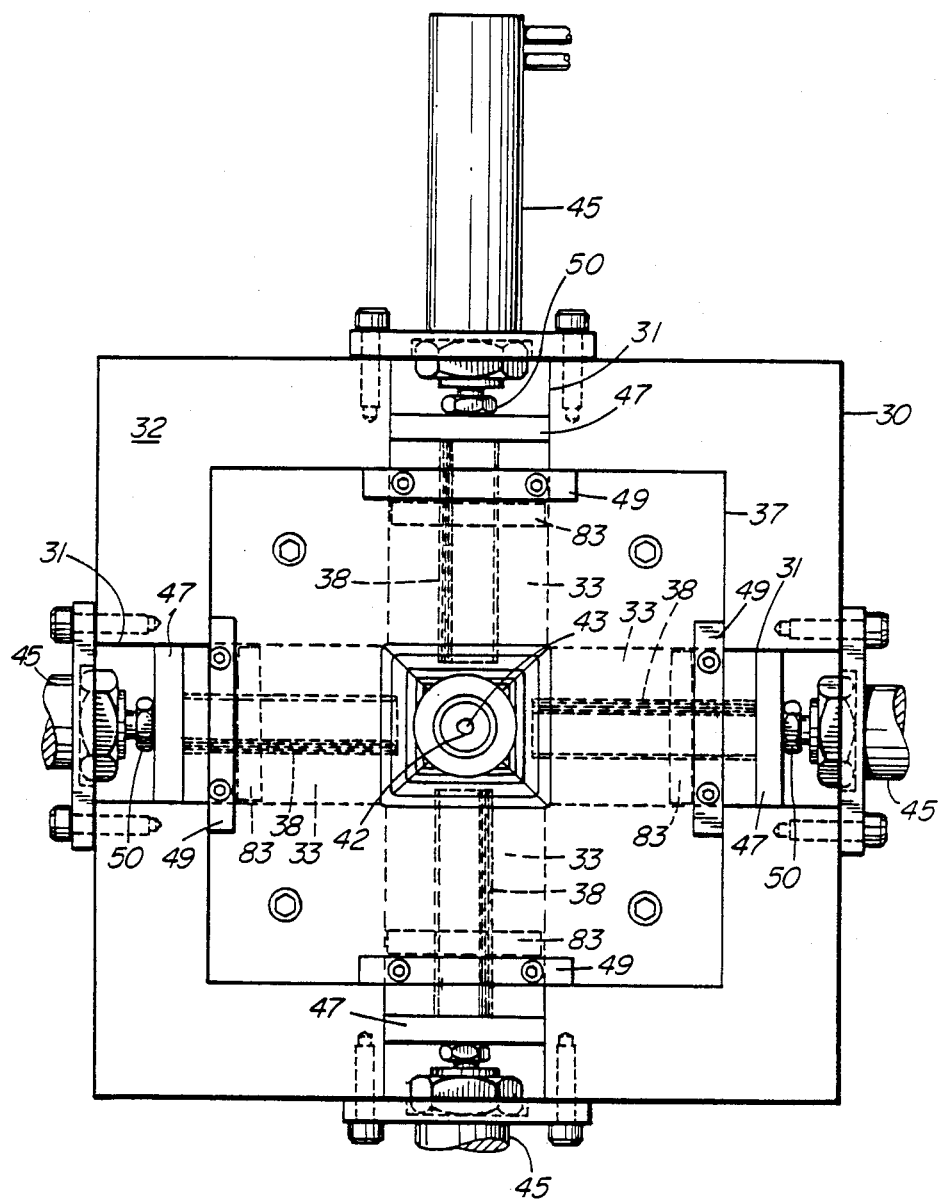
FIG. 12 is a similar view to that of FIG. 7, but with the apparatus in an open condition.

The arrangement is such that the sliding members 33 can be reciprocated outward and inward by the rams 45, moving the inner and outer ends of comb members 38 out and in from a closed condition to an open condition, and then back to a closed condition. At the start of a cycle, the comb members are moved outward. This is illustrated in FIG. 12. A component is positioned on the end of the rod 42 and then the comb members moved inward. The ram 41 is then actuated and the rod 42 pushes the component up past the inner ends of the comb members. The inner ends of the comb members have alternating ribs and grooves, extending vertically. The ribs are very slightly narrower than the gap between adjacent leads, while the grooves are very slightly wider than the width of a lead.

Figure 10:
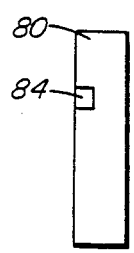
FIGS. 10 and 11 are side views of the two different forms of comb member used in the apparatus of FIGS. 7 and 8.
Figure 11:
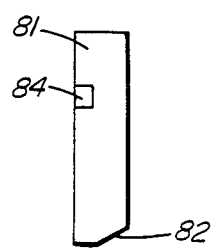

The comb members can be made in different ways. In the example, they are formed by a plurality of laminations of alternating form. One of each form of lamination is shown in FIGS. 10 and 11. Square ended members 60 (FIG. 10) alternate with members 61 (FIG. 11), the members 61 having a chamfered portion 62 at the inner part of the end. The members 61 are also slightly shorter than members 60. This can also be seen in FIG. 8. A rod 63 rests in a slot 64 in each member 60 and 61 to provide a positioning action. Thus, as a component is pushed up by rod 42, the leads enter the grooves formed by members 62 between members 60, which form the ribs. The chamfered portions push the leads inward as the component moves up between the inner ends of the comb members. The leads are bent down, the bending being beyond the yield point of the lead material. All the leads are bent to a common position, being at right angles to the bottom surface of the component, and also parallel.

While two separate stages have been shown, it is possible to mount the apparatus for bending the leads back in, on top of the apparatus for bending the leads out. With the top apparatus in the open condition, a component can be placed on the opening apparatus. After opening of the leads, the component is pushed up through the inward bending apparatus after it has been closed.

What is claimed is:

1. An apparatus for straightening leads on all sides of a rectangular plan form leaded component, comprising:
   lead bending members for each respective side of said component, each lead bending member slidably mounted for reciprocal movement in a direction normal to a respective side of said component;
   a groove formed in each member extending parallel to the respective side of said component;
   means for positioning the leaded component above said lead bending members with lower ends of said leads positioned in said grooves;
   means for sliding said members outward relative to said component in order to bend said leads outward beyond a yield point of the lead material; and
   means for bending all the leads on all respective sides of said component back inward past said yield point.

2. Apparatus as claimed in claim 1, comprising a support member; a plurality of lead bending members slidably mounted on said support member and extending radially from a center.

3. Apparatus as claimed in claim 2, including an actuating member rotatably mounted on said support member for rotation about said center; a top member mounted on said support member and extending over said actuating member; a plurality of channels in said top member extending radially from said center, a lead bending member positioned in each channel and resting on said actuating member; and interengaging means on said actuating member and each lead bending member, whereby on rotation of said actuating member said lead bending members slide in said channels.

4. Apparatus as claimed in claim 3, each said interengaging means comprising; a pin extending from one of said actuating members and a lead bending member and, a slot in the other of said actuating member and a lead bending member, the slot extending at an angle to the direction of movement of said lead bending member; whereby on rotation of said actuating member said pins slide in said slots and move said lead bending members in said channels.

5. Apparatus as claimed in claim 4, said pins extending from said actuating member and said slots extending across said lead bending members.

6. Apparatus as claimed in claim 5, said groove in each lead bending member extending across adjacent to an inner end of the lead bending member, the surface of each lead bending member of reduced height at said inner end.

7. Apparatus as claimed in claim 1, wherein said means for bending said leads inwards comprises:
   a comb member mounted for reciprocal movement in a direction normal to the respective side of said component, said comb member having an inner end surface having alternating ribs and grooves extending in a direction normal to the direction of movement of the comb member and normal to said respective side of said component; and means for moving said component relative to said comb members whereby said leads pass through said grooves, a lead in each groove, to bend the leads inwards.

8. Apparatus as claimed in claim 7, comprising a plurality of comb members extending radially from a center.

9. Apparatus as claimed in claim 8, including a support member, said comb members mounted on said support member.

10. Apparatus as claimed in claim 9, including a plurality of channels in said support member extending radially from said center, a comb member slidingly supported in each channel, and means for moving said comb members inward towards and outward from said center.

11. Apparatus as claimed in claim 10, each said comb member including a sliding member on said support member, a rectangular cross-section groove formed in the sliding member, said groove opening toward said support member, and a comb forming member mounted in said groove.

12. Apparatus as claimed in claim 11, said comb forming member comprising a plurality of laminations, alternate laminations extending a short distance beyond the other laminations, to define said alternating ribs and grooves.

13. Apparatus as claimed in claim 10, each groove of said alternate ribs and grooves having a chamfered portion leading into the groove.

14. Apparatus as claimed in claim 10, including a stop member on each sliding member and an adjustable abutment for each stop member.

15. A method of straightening the leads of a leaded component, comprising:

positioning outer ends of said leads in a groove in each of a plurality of slidable members, a slidable member positioned for each peripheral side of the component;

sliding said slidable member so as to bend the leads outward beyond a yield point of the lead material; and bending the leads back inward to a predetermined position beyond the yield point of the lead material.

16. A method as claimed in claim 15, wherein bending the leads back inward includes the step of pushing the component past a plurality of comb members having alternate ribs and grooves, a comb member positioned for each peripheral side of said component, said grooves guiding and bending the leads inward.

* * * * *